United States Patent
Yamaguchi et al.

(10) Patent No.: US 7,823,785 B2
(45) Date of Patent: Nov. 2, 2010

(54) PLANAR LIGHT SOURCE DEVICE AND LIQUID CRYSTAL DISPLAY DEVICE

(75) Inventors: Hiroshi Yamaguchi, Osaka (JP); Yuusaku Shimaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 9 days.

(21) Appl. No.: 12/301,171

(22) PCT Filed: May 17, 2007

(86) PCT No.: PCT/JP2007/060156
§ 371 (c)(1),
(2), (4) Date: Nov. 17, 2008

(87) PCT Pub. No.: WO2007/135960
PCT Pub. Date: Nov. 29, 2007

(65) Prior Publication Data
US 2009/0207342 A1  Aug. 20, 2009

(30) Foreign Application Priority Data
May 18, 2006 (JP) .............................. 2006-138446

(51) Int. Cl.
*H04N 1/04* (2006.01)
(52) U.S. Cl. ............................. 235/462.06; 235/462.25; 235/462.2
(58) Field of Classification Search ......... 362/600–611; 235/462.01–462.49; 358/475, 474, 484, 358/34
See application file for complete search history.

(56) References Cited

U.S. PATENT DOCUMENTS

| 6,352,357 | B1 | 3/2002 | Woolard |
| 7,076,148 | B2 * | 7/2006 | Nemoto et al. ............... 385/147 |
| 7,538,911 | B2 * | 5/2009 | Sakurai et al. ............... 358/475 |

FOREIGN PATENT DOCUMENTS

| GB | 2 131 544 | 6/1984 |
| JP | 59-119206 | 7/1984 |
| JP | 10-333588 | 12/1998 |
| JP | 11-232025 | 8/1999 |
| JP | 2001-66648 | 3/2001 |
| JP | 2002-502545 | 1/2002 |
| JP | 2002-169480 | 6/2002 |

* cited by examiner

*Primary Examiner* — Anabel M Ton
(74) *Attorney, Agent, or Firm* — Hamre, Schumann, Mueller & Larson, P.C.

(57) ABSTRACT

Provided is a planar light source device (300) having a planar light source with uniform luminance distribution by using a laser light source for outputting a beam-like luminous flux. The planar light source device (300) applies a laser beam from the side surface of a light guide plate (310) through a scanning mirror (330) and periodically scans the entire light guide plate. At that time, a light output (P(t)) of the laser light source (320) is modulated in synchronization with the scanning cycle so that the output is proportional to the temporal differentiation dS/dt of a scanning area (S(t)) from a search start within a scanning period. Thus, changes of the scanning speed and scanning length with time are eliminated and planar lighting with uniform luminance can be performed.

13 Claims, 7 Drawing Sheets

PLANAR LIGHT SOURCE DEVICE AND LIQUID CRYSTAL DISPLAY DEVICE

TECHNICAL FIELD

The present invention relates to a planar light source apparatus that illuminates a liquid crystal display panel from the back and a liquid crystal display apparatus having the planar light source.

BACKGROUND ART

Thin, lightweight liquid crystal display apparatuses capable of image display have rapidly become widespread due to price reductions and the development of high-image-quality technology resulting from advances in manufacturing techniques, and are widely used in personal computer monitors, TV receivers, and the like.

A transmissive liquid crystal display apparatus is generally used as a liquid crystal display apparatus. A transmissive liquid crystal display apparatus is equipped with a planar light source called a backlight, illumination light from which is spatially modulated by a liquid crystal panel and forms an image.

A backlight is often used in a scheme where light is incident from a side of a thin guide light plate using a cold cathode fluorescent tube, which is virtually a linear light source. FIG. 1 shows its basic configuration. FIG. 1A is an observed view of a conventional backlight using a cold cathode fluorescent tube from the emitting face side, and FIG. 1B is its sectional view. FIG. 1A omits showing reflector 130 (described later).

As shown in FIG. 1, the light incident from cold cathode fluorescent tube 120 to incident face 111, which is the side of light guide plate 110, propagates repeating total reflections between the opposing main surfaces. A diffuse reflecting layer or projections and indentations for reflections of specific density distribution and size is formed on the surface of reflecting face 113 opposing emitting face side 112, and composed so as to make part of the propagated light emit. By adjusting adequately density and size distribution of the diffuse reflecting layer or the projections and indentations for reflections, it is possible to illuminate uniformly over the whole of the liquid crystal panel.

140 in FIG. 1 shows the reflecting sheet for reflecting light leaking from reflecting face 113 to the emitting face direction to use the light effectively. Further, 150 shows the optical film for controlling directivity of light emitting from the emitting face, and is adequately combined with a diffusion film and a prismatic sheet according to purposes of the light distribution characteristics.

Furthermore, a light emitting diode (hereinafter "LED") of high luminous efficiency is developed recently and proposed to use for a light source of a backlight of a liquid crystal display.

A method for acquiring planar emission that can be used by lighting back from an LED, which is a point light source, generally includes placing a large number of LEDs at the end face of a light guide plate and inputting light directly. One of the examples is shown in FIG. 2.

FIG. 2 shows configurations of the planar light source in a scheme using LED emitting elements called a side emitter having box-shaped reflecting member in the box-shaped emitting element in the emitting element itself: FIG. 2A is a fragmentally sectional view showing the main part where the light source is the center; and FIG. 2B is a observed view of the light source part from the light guide plate. FIG. 2B omits showing the transparent sealing resin part.

Side emitter LED light source elements 220, which bonds LED chip 221 on element substrate 222 around which reflecting member 223 is provided and sealed by transparent sealing resin 224, and which has connecting terminals 225, are arrayed on wiring substrate 270 and connected.

This light source part is fixed on frame 260 so that the apertures of a plurality of LED light source elements 220 closely face incident face 211 of light guide plate 210.

By constituting as such, it is possible to guide emitting light of which the light source part is stably held in the predetermined place opposing a light guide plate, to the light guide plate. The scheme using LEDs is suitable for use in a thin backlight of a relatively small display size and often used for compact displays such as mobile phones.

However, what happens now is that backlights using LEDs as a light source do not become familiar for large display use such as liquid crystal televisions. One of the causes is that it is difficult to form a compact backlight for large display use requiring large optical output because an LED has limits of density of current feeding through a bonded layer of emitting part and so large chip area is required for acquiring large optical output.

Semiconductor lasers are capable of producing large optical output from small areas compared with LEDs, technology evolution of the basic performance is significantly high including electro-optic conversion efficiency, and so semiconductor lasers become dominant light sources for backlights of large liquid crystal displays in the near future.

Patent Document 1 discloses using a laser light source of wide width emitting light, and reflecting the light by hologram element and guiding the light the side face of the light guide plate.

By this means, a backlight of relatively large area can be expected to be realized by one light source. Patent Document 1: Japanese Patent Application Laid-Open No. 2002-169480

DISCLOSURE OF INVENTION

Problems to be Solved by the Invention

However, in the above-described conventional technique, light intensity distributions in the direction of the width of emitting light of the laser light source would find unevenness in brightness in the backlight. The photons in laser light have a uniform phase and energy and therefore cause severe coherence. By this means, it is very difficult to make light intensity distributions of the laser light uniform over the entirety of the light width, and so, there has been a problem that significant unevenness in brightness is likely to be found in an illumination area.

The present invention has been implemented taking into account of the above-described problem, and it is therefore an object of the present invention to provide a planar light source of uniform brightness throughout an illumination area, using a laser light source producing light forming beams.

Means for Solving the Problem

To solve the above-described problem, the planar light source apparatus of the present invention includes: a light source that emits a light flux forming a beam; a light guide plate having a substantially flat shape, in which one of two opposing main surfaces is an emitting face and an incident face is provided in a side face part, that changes an incident beam light incident to the incident face to a linear emitting light, and emits the linear emitting light from a substantially linear emitting region in the emitting face; and an optical scanning system that scans the linear emitting region by changing a traveling direction of the light flux in a regular scanning cycle and making incident the light flux into the incident face as the incident light, wherein a ratio between a time rate of change of a square measure which a scan track occupies in the linear emitting region and a light intensity of the light flux, is kept substantially fixed over the scanning cycle.

Further, the planar light source apparatus of the present invention adopts a configuration including: a light source that emits a light flux forming a beam; a light guide plate having a substantially flat shape, in which one of two opposing main surfaces is an emitting face and an incident face is provided in a side face part, that changes an incident beam light incident to the incident face to a linear emitting light, and emits the linear emitting light from a substantially linear emitting region in the emitting face; and an optical scanning system that scans the linear emitting region by changing a traveling direction of the light flux in a regular scanning cycle and making incident the light flux into the incident face as the incident light; and a control section that changes output of the light source according to a time rate of change of a square measure which a scan track occupies in the linear emitting region.

Further, the liquid crystal display apparatus of the present invention adopts a configuration including: the above planar light source apparatus; and a liquid crystal display panel illuminated by the planar light source from the back.

ADVANTAGEOUS EFFECT OF THE INVENTION

According to the present invention, uniform brightness can be realized by electric means for synchronizing beam light intensity from a light source with scanning and modulating for light emitting areas varying over time by scanning, and the present invention makes it possible to carry out planar illumination of uniform brightness by a simple configuration.

BEST MODE FOR CARRYING OUT THE INVENTION

Now, embodiments of the present invention will be described in detail with reference to the accompanying drawings.

Embodiment 1

Figure 1A:
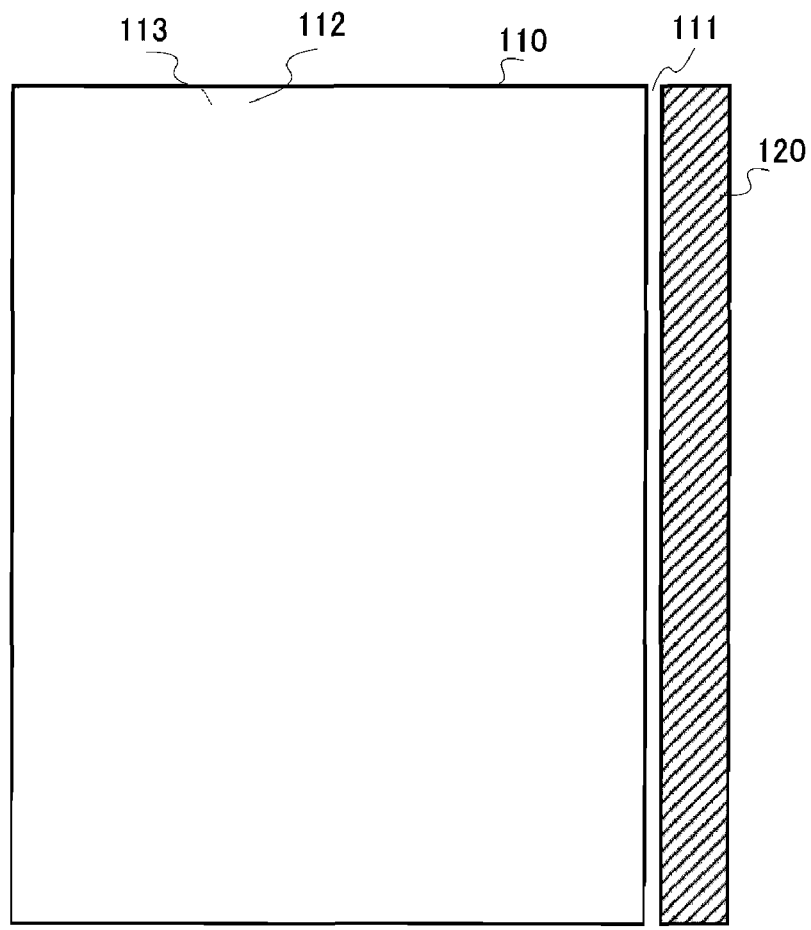
FIG. 1A is a plain view of the conventional planar light source using a cold cathode fluorescent tube.
Figure 1B:
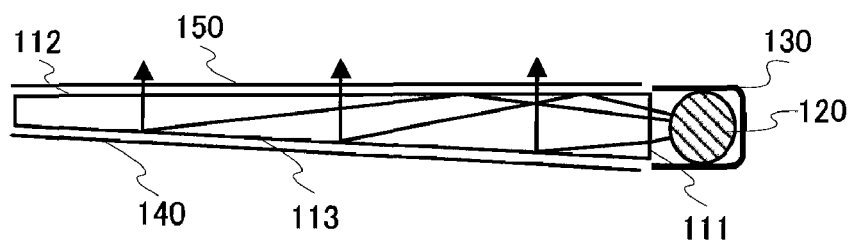
FIG. 1B is a sectional view of the conventional planar light source using a cold cathode fluorescent tube.
Figure 2A:
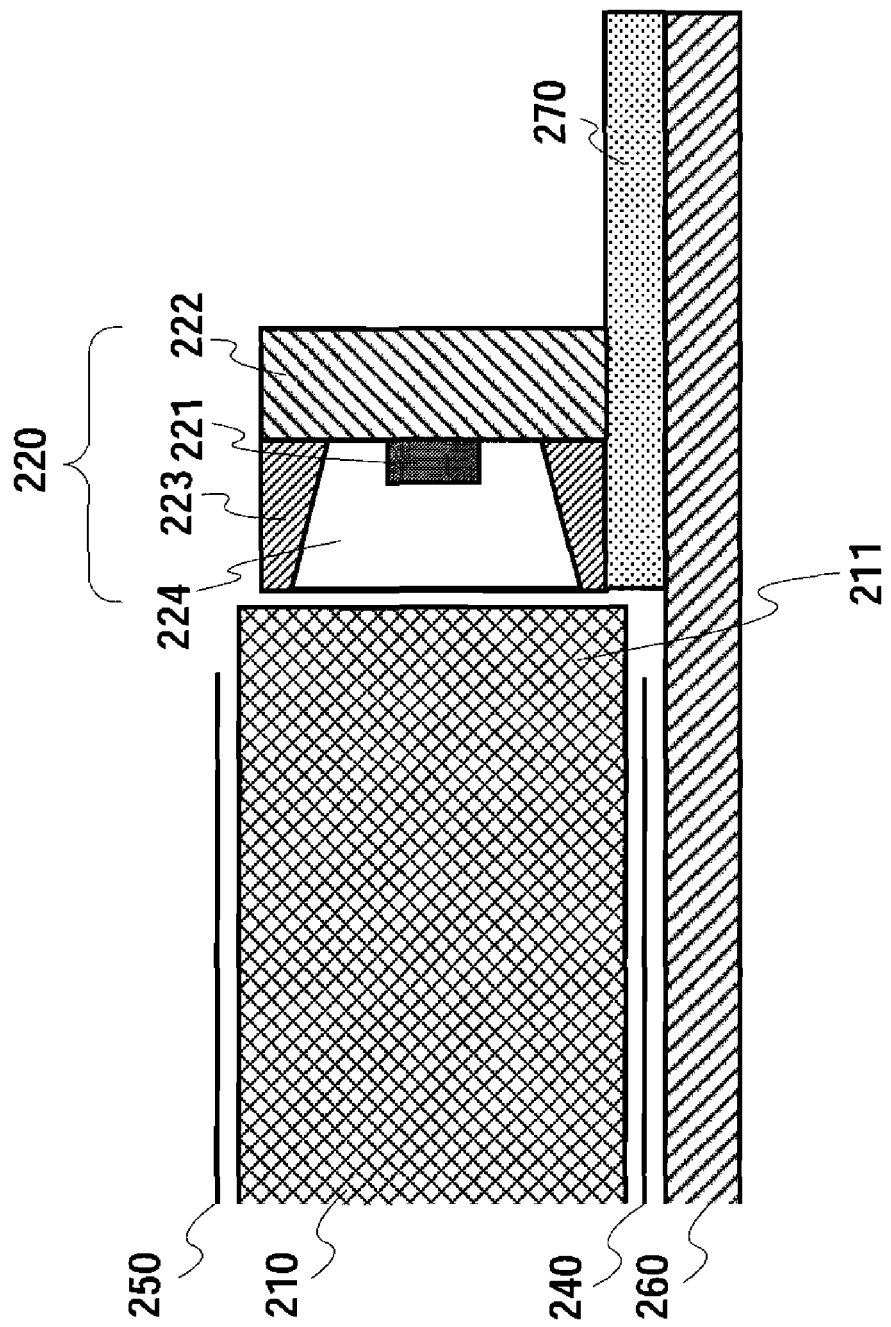
FIG. 2A is a fragmentally sectional view of the conventional planar light source using an LED emitting element.
Figure 2B:
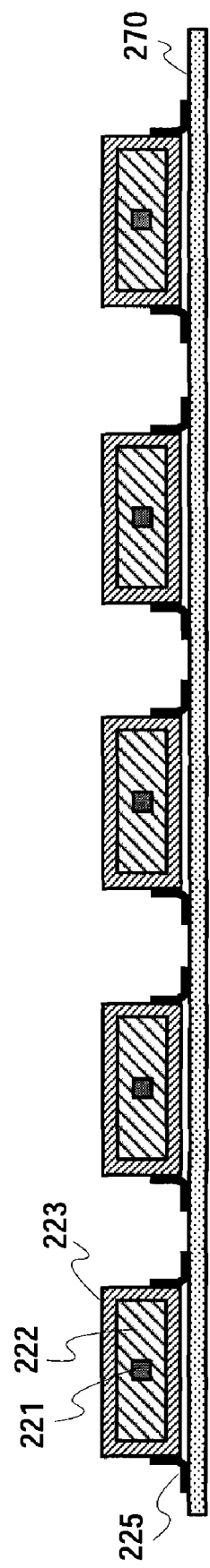
FIG. 2B is a side view of the conventional planar light source using an LED emitting element.
Figure 3:
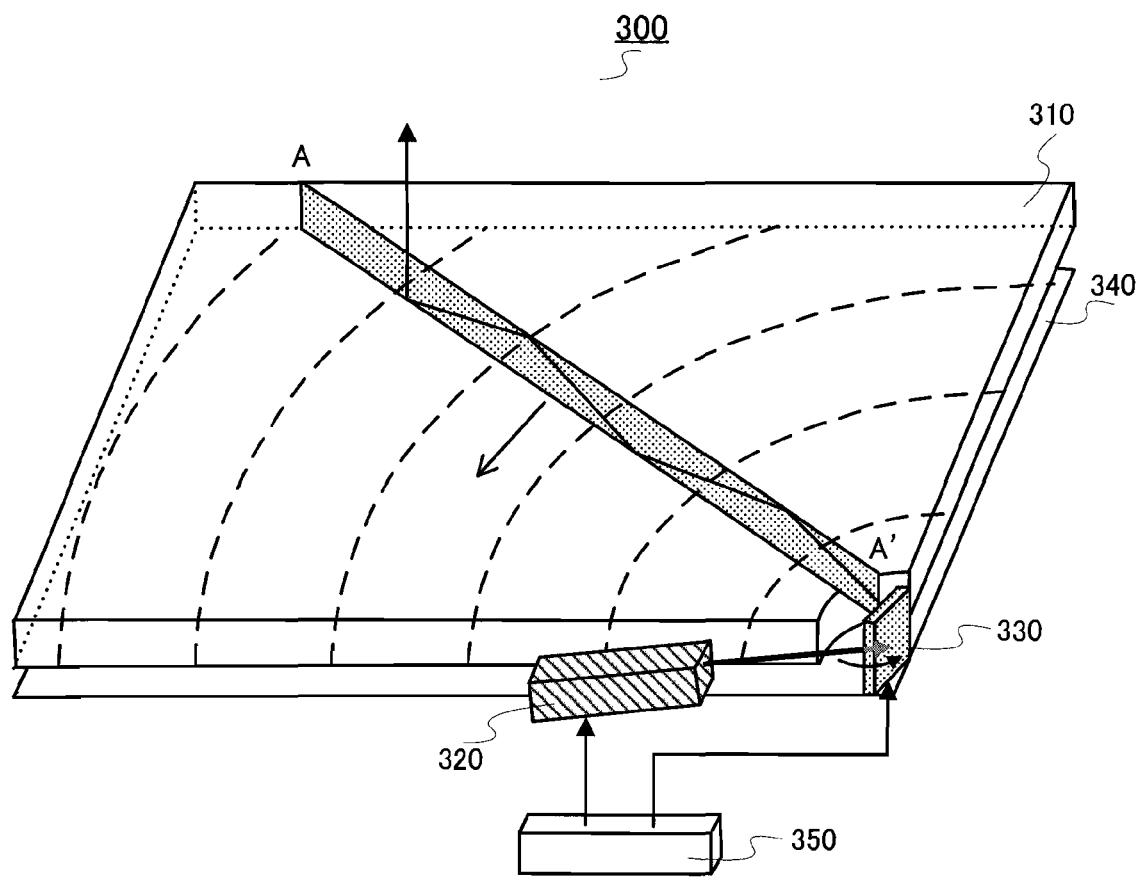
FIG. 3 is a perspective view showing the planar light source apparatus according to Embodiment 1 of the present invention.

FIG. 3 is a perspective view showing the configuration of the planar light source apparatus according to Embodiment 1 of the present invention. In FIG. 3, planar light source apparatus 300 is constituted by light guide plate 310, laser light source 320, scanning mirror 330, reflecting sheet 340 and control circuit 350.

Planar light source apparatus 300 regularly makes a light flux forming a beam from laser light source 320 scan with scanning mirror 330 constituting an optical scanning system, and make the light incident to the incident face provided in a corner part of light guide plate 310. A linear illuminating light is instantaneously formed by an incident light flux, that is, incident light, and the linear illumination light moves according to the scanning of the mirror. The range of scanning angle and the shape of the incident face are adjusted so as to cover the whole of the light guide plate in one cycle.

Light guide plate 310, is virtually flat, where one of the opposing two main surfaces is the emitting face and the incident face is provided in the side face part. Light guide plate 310 changes the incident light forming a beam incident to the incident face, to a linear emitting light, and emits the light from a virtually linear emitting region in the emitting face.

Laser light source 320 is formed with semiconductor lasers comprised of laser diodes and a driving circuit driving the semiconductor lasers by driving current.

Scanning mirror 330 makes incident the light flux forming a beam outputted from laser light source 320 to the incident face of light guide plate 310 by reflecting the light.

Further, scanning mirror 330 receives control signals from control circuit 350 to vibrate or rotate, and makes the linear illumination light scan the whole of the light guide plate. Scanning mirror 330 includes a galvanometer mirror, a polygon mirror, and a micromachine mirror using MEMS (Micro Electro Mechanical Systems). The cycle the above described linear illumination light scans the whole of the light guide plate, is adjusted short enough with respect to the time it takes human eyes to react, so that, to human eyes, the whole of the light guide plate seems to always illuminate a fixed distribution of brightness.

Reflecting sheet 340 reflects the light that leaks from the rear face opposing the emitting face of light guide plate 310, to the side of the emitting face.

Control circuit 350, which is constituted by microprocessors or the like, outputs control signals to the driving system (not shown) of scanning mirror 330 to control the scanning angle of scanning mirror 330. Further, control circuit 350 controls the driving current of laser light source 320 and changes the output of laser light source 320 according to the time rate of change of the square measure the scan track occupies in the linear emitting region.

Figure 4:
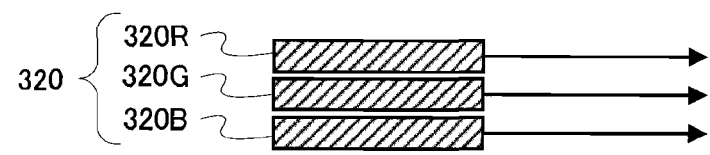
FIG. 4 shows a detail of the laser light source of the planar light source apparatus according to Embodiment 1 of the present invention.

As shown in FIG. 4 (omitted in FIG. 3), white illumination is realized by placing closely red laser light source 320R, green laser light source 320G and blue laser light source 320B so that their optical axes virtually match and forming white laser light source 320 by the three primary colors. The driving circuit of laser light source 320 drives laser light sources 320R, 320G and 320B by respective driving currents. Control circuit 350 controls the driving currents for laser light sources 320R, 320G and 320B to modulate the color and light intensity of the light flux forming a beam. Here, control circuit 350 controls the driving currents of laser light sources 320R, 320G and 320B such that the color of the illumination light formed in light guide plate 310 is fixed.

Figure 5:
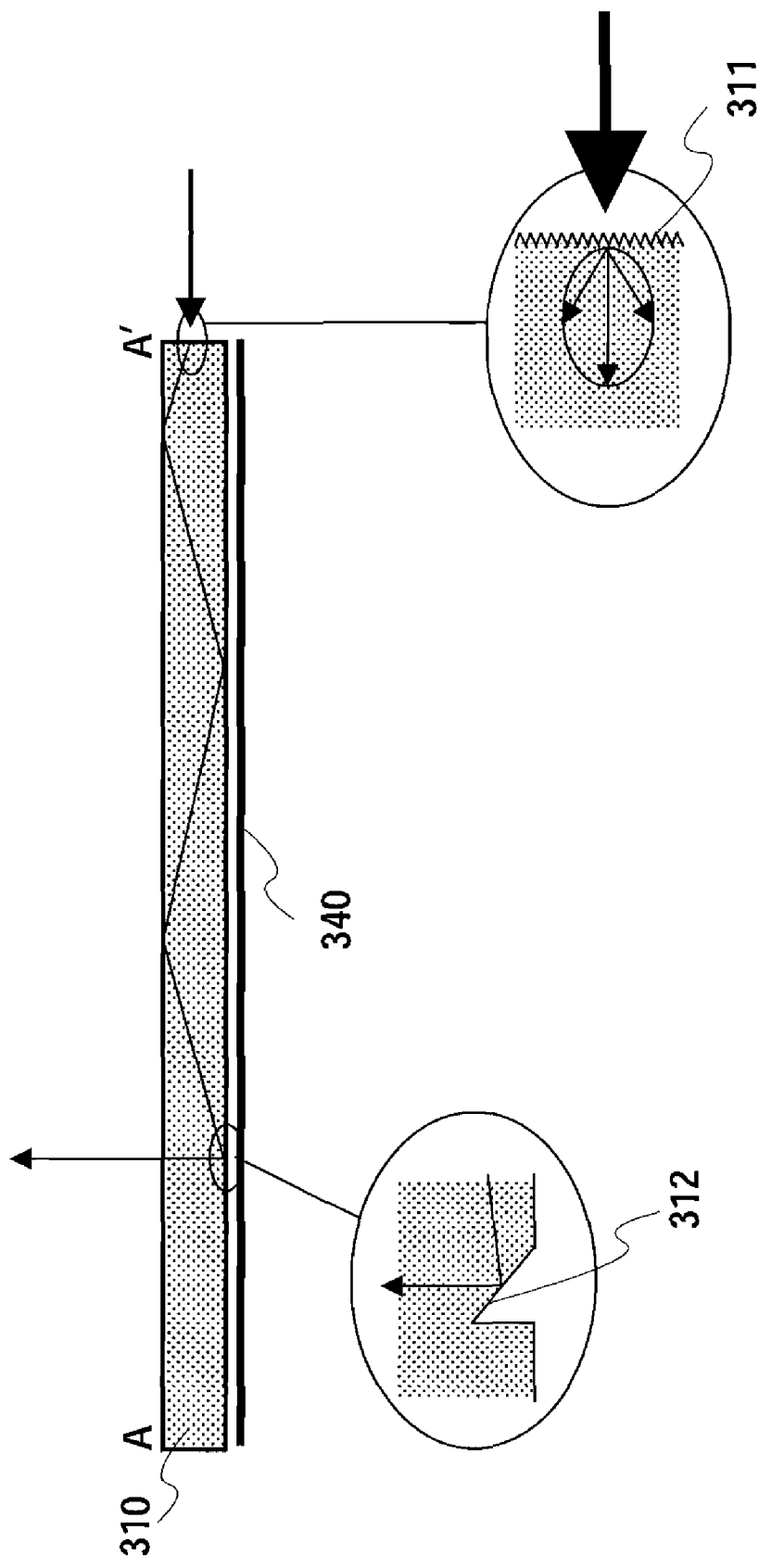
FIG. 5 is a cross-sectional view of the scanned part of the planar light source apparatus according to Embodiment 1 of the present invention.

How the above linear illumination is carried out will be described using FIG. 5. FIG. 5 is a cross-sectional view of the scanned part (A-A' in FIG. 3) and includes a partially enlarged view of the main part.

In the incident face of light guide plate 310, fine projections and indentations, provided in a stripe shape in a longitudinal direction at right angles to the thickness direction, form anisotropic diffusion means 311. Diffusion means 311 is anisotropic and changes the degree of diffusion of light between the thickness direction and other directions of light guide plate 310, so that an incident light flux diffuse more in the thickness direction of light guide plate 310 than in other directions of light guide plate 310. The lights diffused at different angles in the thickness direction propagates following different paths depending on the diffusion angles in a virtually single cross section and repeating total reflections between the two opposing main surfaces.

Fine indentation 312 is formed in part of the rear face opposing the emitting face of light guide plate 310. The light incident into that part is virtually reflected in the normal direction of the emitting face, changed to a linear emitting light and emitted from the virtually linear emitting region in the emitting face. By adjusting the density and dimensions of fine indentations 312, including the length and depth, it is possible to control the distribution of brightness in the longitudinal direction of the linear emitting region.

Here, light guide plate 310 is formed such that the distribution of brightness in longitudinal directions is virtually uniform in each linear emitting region. To be more specific, the shape and density of indentations 312 are adjusted such that, if the longitudinal direction of the above linear emitting region is divided into unit lengths, placing the focus upon the scan track per unit time, the amount of emitting light per unit length is approximately proportional to the width associated with that unit length.

In the course of one cycle, the length of the linear emitting region changes and its moving speed also changes in accordance with the scanning angular velocity of the mirror and the shape of the incident face.

To uniformly illuminate the linear emitting regions following such changing conditions, the light intensity is modulated working with the state of scanning, so that the whole of the emitting face of light guide plate 310 is illuminated uniformly. Its state will be described using FIG. 6.

Figure 6:
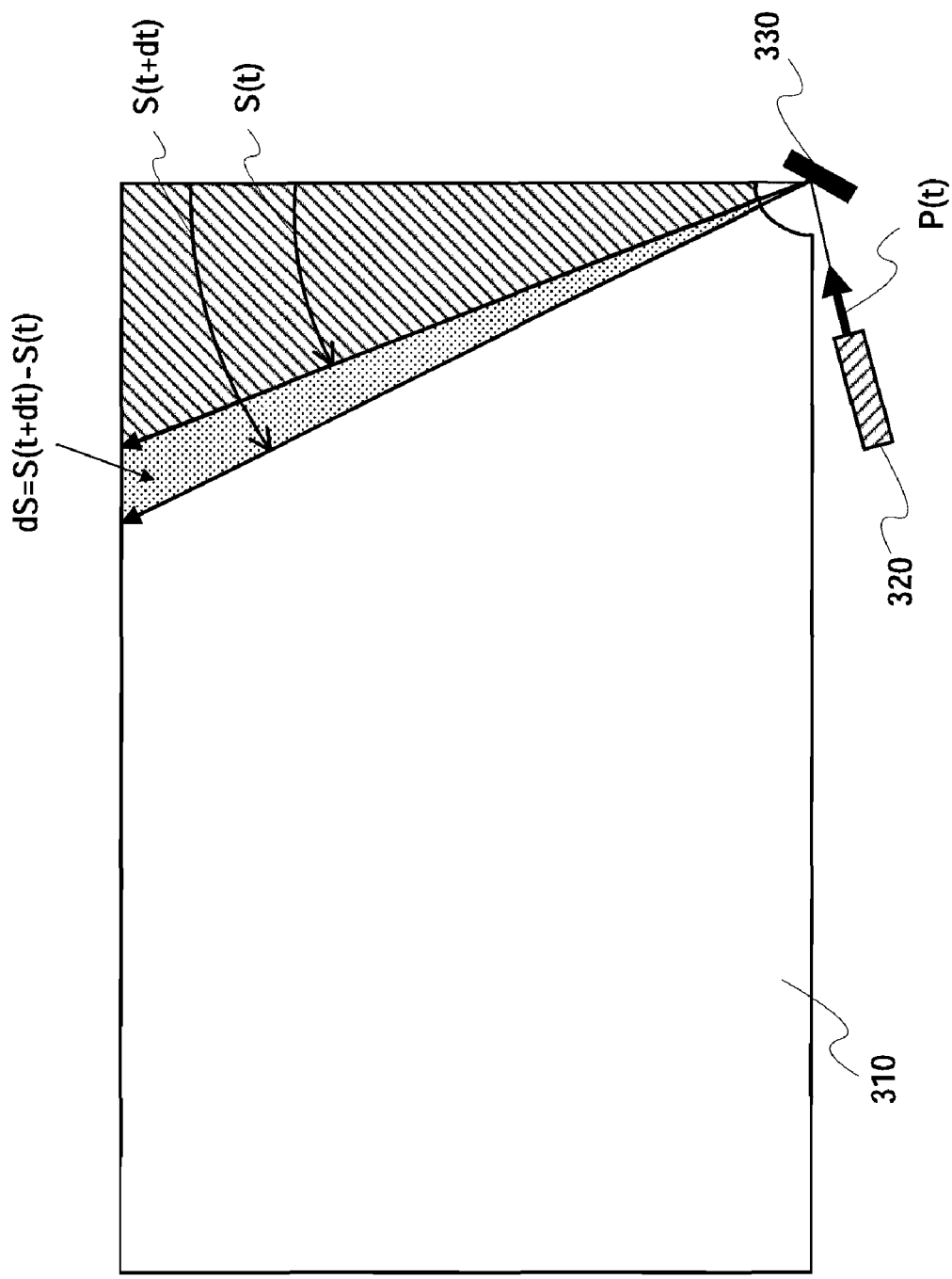
FIG. 6 explains the operations of the planar light source apparatus according to Embodiment 1 of the present invention.

Referring to FIG. 6, let the state in which the linear emitting region is in the right side part of the rectangular light guide plate be t=0, that is, the beginning of the scanning cycle, and the square measure which the scan track where scanning is finished by time t, be the scanning square measure S(t) in that cycle. This function S(t) is determined in accordance with the scanning angle function θ(t) of the scanning mirror, the incident face angle corresponding to θ and so forth.

dS=S(t+dt)−S(t) is the difference between the scanning square measure S(t) at time t and the scanning square measure at the time a small amount of time dt after time t, and therefore gives the area illuminated during a small amount of time dt. Consequently, temporal change of the square measure the scan track occupies in the linear emitting region, that is, time derivative of the above scanning square measure S(t) "dS/dt" is the square measure illuminated per unit time.

The illuminance is proportional to the emitting light flux of laser light source 320 per unit square measure, so that, to keep the illuminance fixed over the entirety of scanning cycle, the ratio between the optical output P(t) (i.e. the light intensity of the above light flux) and dS/dt may be kept constant.

One method of maintaining the ratio of the optical output P(t) and the time derivative of the scanning square measure "dS/dt" fixed is to keep each constant. It is easy to keep the optical output P(t) constant, but it is difficult to keep the time derivative of the scanning square measure "dS/dt" constant.

Relatively high scanning speed is required when the length of the emitting region is relatively short in the scanning cycle, that is, at the start of scanning and at the end of scanning, and low scanning speed is required in the middle part, that is, at the time of illuminating the diagonal line part. In theory it is certainly possible to fulfill the above conditions by the settings of mirror scanning and the shape of the incident face. However, upon driving scanning mirror 330 having limited inertia, it requires large magnitude of torque and relatively long time to approach and return, to maximize the driving angular velocity at the time of the start of scanning and the end of scanning. Not preferably, this results in undesired vibration and radiation and an increase in driving power, and the increase in the inoperative time in the scanning cycle produces a bottleneck for acquiring great brightness. It is difficult to uniformly illuminate the linear emitting regions by control of scanning mirror 330 alone.

Then, according to the present embodiment, after the conditions where scanning mirror 330 scans and the shape of the incident face of light guide plate 310 are adjusted, the optical output P(t) is modulated in proportion to the time derivative of the scanning square measure "dS/dt" in the state. The optical output P(t) of laser light source 320 is virtually proportional to given driving current and can be controlled by the electric driving conditions, and the response time and dynamic range meet the above conditions well.

The time derivative of the scanning square measure "dS/dt" can be calculated from the shape of the incident face, the scanning angular velocity of scanning mirror 330 and the relative positions of the respective members. Moreover, the time derivative of the scanning square measure "dS/dt" can be calculated by driving laser light source 320 and measuring every place of the illuminance on the emitting face in light guide plate 310 after composing planar light source apparatus 300.

The optical output P(t) that is proportional to the time derivative of the scanning square measure "dS/dt" can be found based on the time derivative of the square measure "dS/dt". By the control of control circuit 350, the driving current, that makes possible the found optical output P(t), is given to laser light source 320, so that it is possible to keep the illuminance constant throughout the scanning cycle.

As described above, according to the configuration of the present embodiment, by modulating the optical output in synchronization with the scanning cycle, it is possible to realize uniform brightness in scanning directions without placing too much load upon the optical scanning system. Conditions for adjusting fine indentations 312 formed in light guide plate 310 can control the uniform brightness in beam transmitting directions as in conventional cases. Moreover, without causing undesired vibration and radiation, an increase of the driving power of scanning mirror 330 and an increase of the inoperative time in the scanning cycle, planar light source apparatus 300, where the whole of the effective face is highly uniform in brightness can be realized. Further, planar light source apparatus 300 can produce large optical output from small areas and uses a semiconductor laser of good electro-optic conversion efficiency as a light source, so that it is possible to make a compact backlight for use with large displays and enable reduction in the consumption of the backlight.

Moreover, although with embodiment 1 diffusion means 311 is formed in the incident face of light guide plate 310, an anisotropic diffusion member to diffuse a light flux in the thickness direction of the light guide plate, may be provided in front of the incident face.

Moreover, although fine indentations 312, which are fine structures, are formed in the rear face opposing the emitting face of light guide plate 310, this may also be formed in the emitting face.

Embodiment 2

Figure 7:
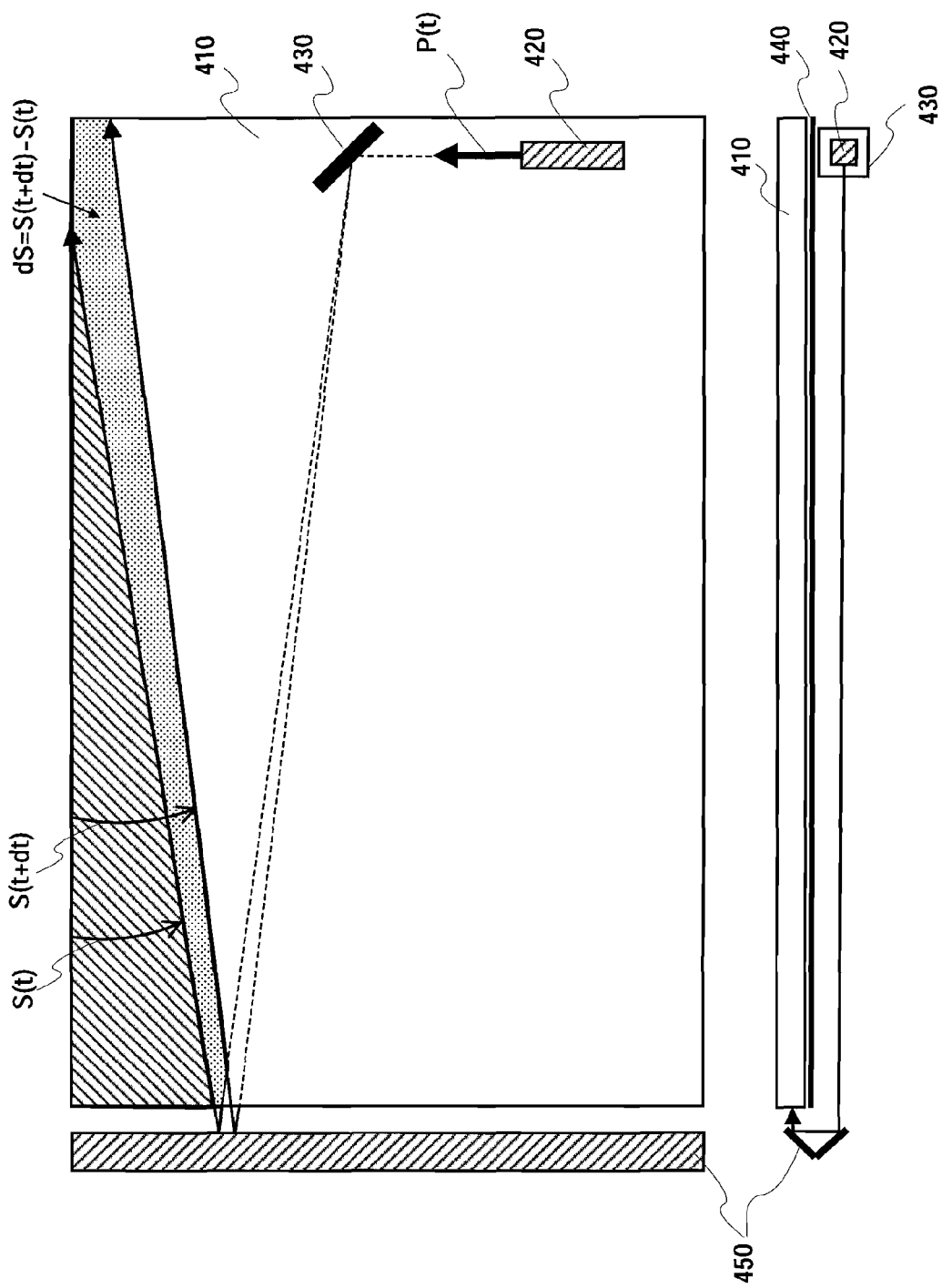
FIG. 7 shows a configuration of the planar light source apparatus according to Embodiment 2 of the present invention.

With Embodiment 1, the incident face of the light guide plate is at a corner part of the light guide plate. However, as shown in FIG. 7, it is also possible to place laser light source 420 and scanning mirror 430 in the rear face of light guide plate 410, reflect incident light at folded mirror 450 and input to incident light from an whole of a side face part of light guide plate 410. 440 is a reflection sheet.

In this case, although the scanning square measure function S(t) is different from the case in FIG. 6, the brightness of the whole of the display is made uniform by applying light intensity modulation proportional to time derivative of the scanning square measure S "dS/dt" to the optical output P(t).

According to the present embodiment, laser light source 420 is placed under light guide plate 410, so that it is possible to improve the device design flexibly. Moreover, the incident face or scanning mirror 430 is not placed at the corner part of light guide plate 410, so that the upper part of the corner part can also be used for the emitting face, and it is possible to make the emitting face larger. Moreover, the optical path from scanning mirror 430 to the incident face of light guide plate 410 can be made long, so that the scanning angle of scanning mirror 430 can be made smaller.

The description above is examples of preferred embodiments of the present invention, and the scope of the present invention is not limited to this.

For example, although cases have been explained above with the embodiments where P(t)/{dS/dt} is fixed by the controlling P(t), it is equally possible to control P(t)/{dS/dt} fixed in combination with controls of the scanning angular velocity and the scanning cycle of the scanning mirror.

Moreover, although cases have been explained above where the distribution of illuminance is uniform throughout the light guide plate, it is equally possible to adopt predetermined, uneven distribution of illuminance by adjusting indentations formed in the light guide plate and modulating the optical output of a laser light source synchronized with the scanning of linear illumination light. For example, it is possible to increase the illuminance in the center part of the light guide plate than the other parts by adjusting the density of indentations such that especially near the center of the longitudinal directions is bright and by modulating P(t) such that P(t)/{dS/dt} becomes high especially near the center of the light guide plate. Generally, human eyes tend to feel a whole of a display is bright when the vicinity of the center is bright. By making the enter part of the light guide plate bright, it is possible to reduce power consumption without making the viewer notice the darkening of the display.

Moreover, although cases have been explained above where a scanning mirror that reflects an emitting light flux of a laser light source is used as a optical scanning system, for changing the traveling direction of a light flux emitted from the laser light source, the present invention is by no means limited to mirrors including scanning mirrors. For example, it is possible to use a deflection element that deflects a light flux and vibrate and rotate this deflection element like the scanning mirror described above.

The planar light source apparatus of the present invention includes: a light guide plate having a substantially flat shape, in which one of two opposing main surfaces is an emitting face and an incident face is provided in a side face part, that changes an incident beam light incident to the incident face to a linear emitting light, and emits the linear emitting light from a substantially linear emitting region in the emitting face; a beam light source that emits a light flux forming a beam to a fixed direction; and an optical scanning system that makes the linear emitting region scan by changing a traveling direction of the light flux in a regular scanning cycle and making incident the light flux into the incident face as the incident light, wherein a ratio between a time rate of change of a square measure which a scan track occupies in the linear emitting region and a light intensity of the light flux, is kept substantially fixed over the scanning cycle. By this means, it is possible to make uniform the average illuminance in the scanning regions which changes over time. In particular, by modulating the light intensity of the light flux forming a beam in proportion to the time rate of change of the scanning square measure, precise control is possible.

The planar light source apparatus of the present invention includes in which the light guide plate propagates the incident light by repeating total reflections of the incident light incident from the incident face between the opposing main surfaces, and allows part of the incident light to escape the total reflection condition by means of very small structures provided on the emitting face or an opposing face of the emitting face and let the part of the incident light emit from the emitting face; and the light guide plate adjusts the shape and density of the very small structures such that an amount of emitting light in a longitudinal direction of the above linear emitting region per unit length is virtually proportional to a width of the scan track per unit time. By this means, it is possible to make uniform the distribution of illuminance in the longitudinal direction of the linear emitting region.

The disclosure of Japanese Patent Application No. 2006-138446, filed on May 18, 2006, including the specification, drawings and abstract, is incorporated herein by reference in its entirety.

INDUSTRIAL APPLICABILITY

The present invention enables the planar light source apparatus providing excellent uniformity of brightness with small number of parts and a simple composition. The present invention can contribute to making the apparatus lighter and making the quality higher by using in a backlight of liquid crystal display apparatuses including liquid crystal display televisions.

The invention claimed is:

1. A planar light source apparatus comprising:
 a light source that emits a light flux forming a beam;
 a light guide plate having a substantially flat shape, in which one of two opposing main surfaces is an emitting face and an incident face is provided in a side face part, that changes the light flux incident to the incident face to a linear emitting light, and emits the linear emitting light from a substantially linear emitting region in the emitting face; and an optical scanning system that makes the linear emitting region scan across the emitting face by changing a traveling direction of the light flux in a regular scanning cycle and making incident the light flux into the incident face as the incident light, wherein a ratio, between a time derivative of a scanning square measure of the linear emitting region across the emitting face and a light intensity of the light flux, is kept substantially fixed over the scanning cycle.

2. A planar light source apparatus comprising:

a light source that emits a light flux forming a beam;

a light guide plate having a substantially flat shape, in which one of two opposing main surfaces is an emitting face and an incident face is provided in a side face part, that changes the light flux incident to the incident face to a linear emitting light, and emits the linear emitting light from a substantially linear emitting region in the emitting face; and an optical scanning system that scans the linear emitting region across the emitting face by changing a traveling direction of the light flux in a regular scanning cycle and making incident the light flux into the incident face as the incident light; and a control section that changes output of the light source according to a time derivative of a scanning square measure of the linear emitting region across the emitting face.

3. The planar light source apparatus according to claim 2, wherein:

the light source comprises:
  a laser; and
  a driving circuit that drives the laser by a driving current; and the control section controls the driving current.

4. The planar light source apparatus according to claim 1, wherein:

the light guide plate propagates the incident light by repeating total reflection condition of the incident light incident from the incident face between the opposing main surfaces, and allows part of the incident light to escape the total reflections by means of very small structures provided on the emitting face or an opposing face of the emitting face and let the part of the incident light emit from the emitting face; and the light guide plate adjusts the shape and density of the very small structures such that an amount of emitting light in a longitudinal direction of the above linear emitting region per unit length is virtually proportional to a width of the scan track per unit time.

5. The planar light source apparatus according to claim 1, wherein the light guide plate has a diffusion section that diffuses the incident light in the incident face.

6. The planar light source apparatus according to claim 5, wherein the diffusion section is anisotropic and diffuses the incident light in a thickness direction of the light guide plate such that a degree of an optical diffusion of the light varies between the thickness direction and other directions.

7. The planar light source apparatus according to claim 1, further comprising:

a diffusion member that diffuses the light flux forming a beam and inputs the light flux forming a beam to the incident face.

8. The planar light source apparatus according to claim 7, wherein the diffusion member comprises an anisotropic diffusion member that diffuses the light flux forming a beam in a thickness direction of the light guide plate.

9. The planar light source apparatus according to claim 1, wherein the light source comprises a plurality of beam light sources of different luminous wavelengths.

10. The planar light source apparatus according to claim 1, wherein the plurality of light sources comprise a red light source, a green light source and a blue light source.

11. A liquid crystal display apparatus comprising:

a planar light source apparatus according to claim 1; and
a liquid crystal display panel illuminated by the planar light source from the back.

12. The planar light source apparatus according to claim 1, wherein the light guide plate is shaped so that a temporal change is produced in a length or moving speed of the linear emitting region during the scanning cycle in conjunction with an operation of the optical scanning system.

13. The planar light source apparatus according to claim 1, wherein the optical scanning system operates to produce a temporal change in a length or moving speed of the linear emitting region during the scanning cycle.

* * * * *